(12) United States Patent
Su et al.

(10) Patent No.: US 11,217,736 B2
(45) Date of Patent: Jan. 4, 2022

(54) DISPLAY PANEL

(71) Applicant: Qisda Corporation, Taoyuan (TW)

(72) Inventors: Chih-Chieh Su, Hsinchu County (TW); Chen-Yang Hu, Taoyuan (TW); Rung-Guang Hu, Taoyuan (TW)

(73) Assignee: Qisda Corporation, Taoyuan (TW)

( * ) Notice: Subject to any disclaimer, the term of this patent is extended or adjusted under 35 U.S.C. 154(b) by 0 days.

(21) Appl. No.: 16/826,321

(22) Filed: Mar. 23, 2020

(65) Prior Publication Data

US 2020/0313055 A1 Oct. 1, 2020

(30) Foreign Application Priority Data

Mar. 28, 2019 (TW) ................................. 108110887

(51) Int. Cl.
*H01L 33/62* (2010.01)
*H01L 25/075* (2006.01)
*H01L 33/58* (2010.01)
*G09G 3/32* (2016.01)

(52) U.S. Cl.
CPC ............... *H01L 33/62* (2013.01); *G09G 3/32* (2013.01); *H01L 25/0753* (2013.01); *H01L 33/58* (2013.01)

(58) Field of Classification Search
CPC ..... H01L 33/62; H01L 25/0753; H01L 33/58; G09G 3/32
See application file for complete search history.

(56) References Cited

U.S. PATENT DOCUMENTS

| 10,152,914 B2 * | 12/2018 | Meersman | G09G 3/32 |
| 2015/0267907 A1 * | 9/2015 | Thompson | F21K 9/20 |
| | | | 362/249.06 |
| 2018/0323180 A1 * | 11/2018 | Cok | H01L 25/042 |
| 2019/0114961 A1 * | 4/2019 | Chang | G09G 3/20 |
| 2019/0333901 A1 * | 10/2019 | Cok | H01L 21/6835 |
| 2020/0111403 A1 * | 4/2020 | Kim | H01L 25/0753 |

(Continued)

FOREIGN PATENT DOCUMENTS

| CN | 105044964 A | 11/2015 |
| CN | 206115896 U | 4/2017 |

(Continued)

OTHER PUBLICATIONS

Office action of counterpart application by SIPO dated Oct. 30, 2020.

(Continued)

*Primary Examiner* — Victor A Mandala

(57) ABSTRACT

A display panel formed by connecting a plurality of panels, includes a first substrate, a plurality of first light-emitting elements, a first patterned conductive layer and a first driving circuit device. The first substrate has a first light output surface and a first sidewall, wherein the first sidewall connects to the first light output surface, and forms a non-180° angle with the first light output surface. The first light-emitting elements are disposed on the first light output surface. The first patterned conductive layer is disposed on the first sidewall. The first driving circuit device is disposed on the first substrate, adjacent to an edge of the first substrate and electrically connected to one of the first light-emitting elements.

17 Claims, 2 Drawing Sheets

10

(56) References Cited

U.S. PATENT DOCUMENTS

| | | | |
|---|---|---|---|
| 2020/0118988 A1* | 4/2020 | Yueh | G09G 3/32 |
| 2020/0163246 A1* | 5/2020 | Yueh | H05K 7/1451 |
| 2020/0212021 A1* | 7/2020 | Yueh | H01L 31/02327 |
| 2020/0251450 A1* | 8/2020 | Scholz | H01L 33/62 |
| 2020/0295120 A1* | 9/2020 | Bower | G06F 3/147 |
| 2021/0150947 A1* | 5/2021 | Ting | H05K 1/189 |

FOREIGN PATENT DOCUMENTS

| | | |
|---|---|---|
| CN | 107302011 A | 10/2017 |
| CN | 109167860 A | 1/2019 |
| CN | 109326226 A | 2/2019 |
| TW | 201319679 A | 5/2013 |
| TW | 201610948 A | 3/2016 |

OTHER PUBLICATIONS

Office action of counterpart application by Taiwan IP Office dated Feb. 27, 2020.

* cited by examiner

DISPLAY PANEL

This application claims the benefit of Taiwan application Serial No. 108110887, filed Mar. 28, 2019, the subject matter of which is incorporated herein by reference.

BACKGROUND

Technical Field

The disclosure in generally relates to a display apparatus, and more particularly to a display panel formed by splicing a plurality of substrates.

Description of the Related Art

With the advancement of technology, the display apparatus with higher quality and more functions, such as more comfortable, large size, high resolution, multi-frequency, digital painting, are required. Traditionally, in order to provide a larger size display, liquid crystal displays (LCDs) splicing technology has been provide to splice and combine a plurality of LCD panels to form a single display screen. However, due to the technical limitation, substantially seamless splicing is hardly to be achieved, visual perception of splicing seams cannot be thoroughly eliminated.

In comparison with LCDs, self-light-emitting displays (such as micro-light-emitting diode (micro-LED) displays) that have advantages of self-luminous, low small size power consumption, high color saturation and high response speed and have been considered as one of the hot trends of next generation display technology. However, the micro-LED technology involves a mass transfer process which requiring to batch transfer a plurality of separated micro-LED dies from a carrier wafer onto a prepared receiving substrate. With the trend of size shrinkage in micro-LEDs, there may be a trade-off between manufacturing cost and efficiency. If a large number of micro-LED dies are transferred at one time, the transferring tools with extremely high precision and expensive is required, and the process yield is difficult to increase; if only a small amount of micro-LED dies are transferred at each time, the processing time will be increased significantly, and the production capacity will be difficult to increase.

To solve this problem, the prior art has previously combined several small-sized micro-LED display panels into a larger-sized display panel by a splicing process. However, each of the small-sized micro-LED display panels requires dense wirings and driving circuit devices disposed on the edge of the panel substrate for driving the same, and these wirings and driving circuit devices may be still visible after splicing. A black matrix is thus applied on the edge of the small-sized micro-LED display panels to cover these visible wirings and driving circuit devices, for the purposes of improving image quality of the larger-sized display panel. In addition, how to effectively integrate and simplify these wirings and driving circuit devices is also considered as another important issue in this technical field, when these small-sized display panels are spliced into a larger-sized display panel. Besides, the black matrix that are disposed on the edge of the panel substrate may highlight the stitching seams of the adjacent small-sized micro-LED display panels, after splicing, and seriously affect the display quality of the larger-sized display panel.

Therefore, there is a need of providing an improved display panel to obviate the drawbacks encountered from the prior art.

SUMMARY

One aspect of the present disclosure is to provide a display panel formed by splicing a plurality of substrates, wherein the display panel includes a first substrate, a plurality of first light-emitting elements, a first patterned conductive layer and a first driving circuit device. The first substrate has a first light output surface and a first sidewall, wherein the first sidewall connects to the first light output surface and forming a non-180° angle with the first light output surface. The first light-emitting elements are disposed on the first light output surface. The first patterned conductive layer is disposed on the first sidewall. The first driving circuit device is disposed on the first substrate, adjacent to an edge of the first substrate, and electrically connected to one of the first light-emitting elements.

Another aspect of the present disclosure is to provide a display panel formed by splicing a plurality of substrates, wherein the display panel includes a plurality of frame substrates, a plurality of core substrates, a driving circuit device, a black light-shielding layer, a plurality of frame light-emitting elements, a plurality of core light-emitting elements, a frame patterned conductive layer and a core patterned conductive layer. The plural frame substrates are connected with each other to define a frame portion of the display panel. The frame portion has a frame light output surface, an outer sidewall surrounding the frame light output surface and an inner sidewall opposite to the outer sidewall, wherein the inner sidewall is connected to the frame light output surface to form a non-180° angle. The plural core substrates are connected with each other to define a core portion of the display panel. The core portion has a core light output surface and a core sidewall, wherein the core light output surface is connected to the core sidewall to form a non-180° angle; the inner sidewall faces the core sidewall; and the core light output surface is coplanar with the frame light output surface. The driving circuit device is disposed either on the frame light output surface or on a surface opposite to the frame light output surface, and adjacent to the outer sidewall. The plural core light-emitting elements are disposed on the core light output surface. The frame patterned conductive layer is disposed on the inner sidewall and electrically connected to at least one of the plural frame light-emitting elements. The core patterned conductive layer is disposed on the core sidewall, electrically in contact with the frame patterned conductive layer, and electrically connected to at least one of the plural core light-emitting elements. The black light-shielding layer is disposed on the frame light output surface and adjacent to the outer sidewall.

In accordance with the aforementioned embodiments of the present disclosure, a display panel formed by splicing a plurality of substrates is provided, wherein the display panel includes at least one substrate adjacent to the outer edge of the display panel. The substrate has a plurality of light-emitting elements, a sidewall, a patterned conductive layer, a driving circuit device, and a black light-shielding layer. The light-emitting elements are disposed on a light output surface that connects to the sidewall to from a non-180° angle. The patterned conductive layer is disposed on the sidewall. The driving circuit device is disposed adjacent to the edge of the substrate. The black light-shielding layer overlaps with the driving circuit device. When two adjacent substrates are spliced, the light-emitting elements respectively disposed on the two adjacent spliced substrates can be electrically connected to the same driving circuit device disposed on the edge of the display panel by the patterned conductive layers of the spliced substrates, whereby image signal can be provided by the driving circuit device for displaying image. The driving circuit device is covered with the black light-shielding layer to prevent the reflected light of the driving circuit device from adversely affecting the display quality of the display panel.

In one embodiment of the present disclosure, a plurality of frame substrates adjacent to the edge of a display panel are spliced to form a frame portion of the display panel, by which a core portion of the display panel formed by a plurality of core substrates splicing with each other is surrounded. Wherein, the driving circuit devices of the display panel are merely disposed on one or more of the frame substrates adjacent to the peripheral region of the display panel; and no any driving circuit device is arranged on the core substrates. A plurality of core light-emitting elements disposed on the core substrates and a plurality of frame light-emitting elements disposed on the frame substrates can display an image in response to image signal provided by the same driving circuit devices.

BRIEF DESCRIPTION OF THE DRAWINGS

The above objects and advantages of the present disclosure will become more readily apparent to those ordinarily skilled in the art after reviewing the following detailed description and accompanying drawings, in which.

DETAILED DESCRIPTION

Figure 1:
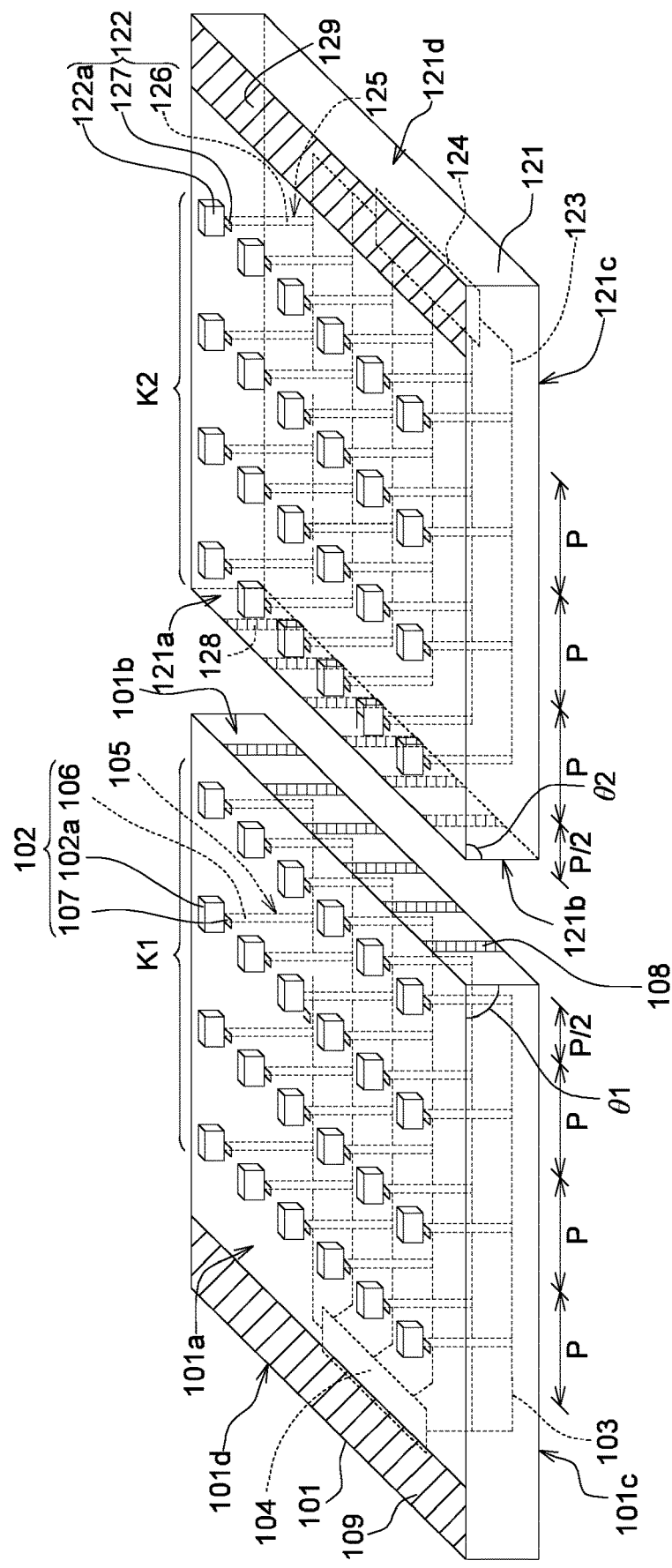
FIG. 1 is a simplified prospective view illustrating a display panel, in accordance with one embodiment of the present disclosure.

The embodiments as illustrated below provide a display panel to solve the visual problems caused by the splicing seams. The present disclosure will now be described more specifically with reference to the following embodiments and the accompanying drawings illustrating the structure and arrangements thereof.

It is to be noted that the following descriptions of preferred embodiments of this disclosure are presented herein for purpose of illustration and description only. It is not intended to be exhaustive or to be limited to the precise form disclosed. Also, it is also important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present disclosure. In addition, the illustrations may not be necessarily drawn to scale, and the identical or similar elements of the embodiments may be designated with the same reference numerals.

FIG. 1 is a prospective view illustrating a display panel 10, in accordance with one embodiment of the present disclosure. The method for fabricating the display panel 10 includes steps as follows: Firstly, a first substrate 101 including a first light output surface 101a and a first sidewall 101b is provided, wherein the first sidewall 101b connects to the first light output surface 101a, and forms a non-180° angle $\Theta 1$ with the first light output surface 101a. In some embodiments of the present disclosure, the first substrate 101 can be a light transmissive semiconductor substrate (for example, a germanium substrate), a glass substrate, a ceramic substrate, a flexible plasticized substrate (for example, a polyvinyl chloride (PVC) film), or other suitable material substrate. In the present embodiment, the first substrate 101 is a glass substrate.

Next, a plurality of first light-emitting elements 102 are formed on the first light output surface 101a. In some embodiments of the present disclosure, the forming of the first light-emitting elements 102 includes steps as follows: First, a plurality of EL units (not shown) including at least one micro-LED are formed on an epitaxial substrate (not shown) by performing an epitaxial process; and the epitaxial substrate is then subjected to wafer dicing, dividing these EL units to form a plurality of micro-LED dies 102a. Thereafter, the micro-LED dies 102a are transferred, using mechanical tools (not shown) from the epitaxial substrate to another temporary substrate (not shown), and then are transferred from the temporary substrate to the first substrate 101. The material constituting the epitaxial substrate may be sapphire, silicon carbide (SiC), silicon (Si), zinc oxide (ZnO), magnesium oxide (MgO), aluminum nitride (AlN), gallium nitride (GaN) or the arbitrary combinations thereof.

In some embodiments of the present disclosure, prior to transferring the micro-LED dies 102a to the first substrate 101, a plurality of first wires 103 are formed on the first light output surface 101a or the surface 101c of the first substrate 101 opposite to the first light output surface 101a to electrically connect to a driving circuit device 104 disposed on the peripheral region of the first substrate 101 (e.g., the area adjacent to the first edge 101d of the first substrate 101). Each of the micro-LED dies 102a that are transferred to the first substrate 101 can be electrically connected to one of the first wires 103 through a conductive plug 106 to form one of the first light-emitting elements 102. The plural first light-emitting elements 102 can be arranged on the first light output surface 101a to form a pixel array K1; and each of the first light-emitting elements 102 can respectively respond to the image signal provided by the driving circuit 104 to either turn on or turn off for displaying images.

In the present embodiment, the first wires 103 are formed on the surface 101c of the first substrate 101 opposite to the first light output surface 101a. The forming of the conductive plugs 106 includes steps as follows: First, the first substrate 101 is drilled, for example, using an example a through glass via (TGV) technology, to form a plurality of through holes 105B on the first light-emitting surface 101a. Then, a conductive material (such as, copper (Cu), tungsten (W), aluminum (Al), gold (Au), silver (Ag) or any alloys constitute by the arbitrary combinations thereof, or metal oxides of the above, or other suitable conductive material) is then formed by sputtering technology on the sidewall of each of the through holes 105 to form the conductive plug 106. Meanwhile, a plurality of bonding pads 107 are formed on the first light output surface 101a, so as to make each of the conductive plugs 106 passing through the first substrate 101 has one end electrically connected to one of the bonding pads 107 and another end electrically connected to the corresponding one of the first wires 103. Each of the micro-LED dies 102a that are transferred to the first substrate 101 can be landed on one of the bonding pads 107 and electrically connected to the driving circuit device 104 through a corresponding bonding pad 107, a corresponding conductive plug 106 and a corresponding first wire 103. Each of the aforementioned first light-emitting elements 102 can be regarded as one pixel, and each two adjacent pixels have a pixel pitch P there between. For example, in some embodiments of the present disclosure, each pixel (i.e., the first light-emitting element 102) includes a plurality of micro-LED dies 102a respectively emitting different light of different colors (for example, three primary colors of red (R), green (G), and blue (B)).

Subsequently, a first patterned conductive layer 108 is formed on the first sidewall 101b to make the first patterned conductive layer 108 electrically connected to the first wires 103. In some embodiments of the present disclosure, the forming of the first patterned conductive layer 108 includes steps as follows: A conductive material layer (not shown) is firstly formed on the first sidewall 101b. Thereafter, a portion of the conductive material layer 108A is removed (for example) by etching or laser, to form the first patterned conductive layer 108. In some other embodiments of the present disclosure, the forming of the first patterned conductive layer 108 includes steps as follows: A patterned photoresist layer (not shown) is formed on the first sidewall 101b. A conductive material is then deposited on the first sidewall 101b using the patterned photoresist layer as a mask to form the first patterned conductive layer 108. In the present embodiment, the first patterned conductive layer 108 may extend vertically upward beyond the first sidewall 101b, and is electrically connected to the first wires 103 formed on the first light output surface 101a of the first substrate 101. Alternatively, the first patterned conductive layer 108 may extend vertically downward beyond the first sidewall 101b to be electrically connected to the first wires 103 formed on the surface 101c of the first substrate 101 opposite to the first light output surface 101a.

In addition, in order to prevent the first driving circuit device 104 from reflecting light and affecting the display quality of the display panel 10, a first black light-shielding layer 109 may be formed (or coated) on a peripheral region of the first light output surface 101a adjacent to the first edge 101d of the first substrate 101 for overlapping the first driving circuit device 104.

Next, in the same manner, a second substrate 121 is provided, and a plurality of second light-emitting elements 122 are formed on the second substrate 121. Wherein, the second substrate 121 has a second light output surface 121a and a second sidewall 121b connected to the second light output surface 121a, and the second light output surface 121a forms a non-180° angle Θ2 with the second sidewall 121b. A plurality of second wires 123 are formed on the second light output surface 121a or the surface 121c of the second substrate 121 opposite to the second light output surface 121a to electrically connect to a driving circuit device 124 disposed on the peripheral region of the second substrate 121 (e.g., the area adjacent to the second edge 121d of the second substrate 121); and each of the second light-emitting elements 122 is electrically connected to driving circuit device 124 through the second wires 123. A second patterned conductive layer 128 is formed on the second sidewall 121b to electrically connect to the second wires 123.

For example, in the present embodiment, the second wires 123 are formed on the surface 121c of the second substrate 121 opposite to the second light output surface 121a. The second light output surface 121a further includes a plurality of through holes 125; a conductive plug 126a is formed on the sidewall of each of the through holes 125 by sputtering a conductive material (such as, Cu, W, Al, Au, Ag or any alloys constitute by the arbitrary combinations thereof, or metal oxides of the above, or other suitable conductive material); and a plurality of bonding pads 127 are formed on the second light output surface 121a. Each conductive plug 126a has one end electrically connected to one of the bonding pads 127 and another end electrically connected to the corresponding one of the second wires 123. Each of the micro-LED dies 122a is landed on a corresponding bonding pad 127 and electrically connected to a second driving circuit device 124 through a corresponding bonding pad 127, a corresponding conductive plugs 126 and a corresponding second wire 123. Each of the aforementioned second light-emitting elements 122 can be regarded as one pixel; and the plural second light-emitting elements 122 can be arranged on the second light output surface 121a to form a pixel array K2. For example, each of the pixels (i.e., the second light-emitting elements 122) may include a plurality of micro-LED dies 122a respectively emitting different light of different colors (for example, three primary colors of R, G, and B).

Similarly, in order to prevent the second driving circuit device 124 from reflecting light and affecting the display quality of the display panel 10, a black light-shielding layer 129 may be formed (or coated) on a peripheral region of the second light output surface 121a adjacent to the second edge 121d of the second substrate 121 for overlapping the second driving circuit device 124.

Subsequently, the first substrate 101 and the second substrate 121 are spliced, and a series of back-end processes (not shown) are then carried out to form the display panel 10. In the present embodiment, the first patterned conductive layer 108 disposed on the first sidewall 101b of the first substrate 101 and the second patterned conductive layer 128 disposed on the second sidewall 121b of the second substrate 121 may match and contact with each other. The second light output surface 121a is coplanar with the first light output surface 101a. The second light-emitting elements 122 can be electrically connected to the first driving circuit device 104 through the first patterned conductive layer 108, the second patterned conductive layer 128, the first wires 103 and the second wires 123, and each of the second light-emitting elements 122 can respectively respond to the image signal provided by the first driving circuit device 104 to either turn on or turn off for displaying images.

However, the image displaying manners of the first light-emitting elements 102 and the second light-emitting elements 122 are not limited thereto. For example, in some other embodiments of the present disclosure, each of the first light-emitting elements 102 and the second light-emitting elements 122 can respectively respond to the image signal provided by the second driving circuit device 124 disposed on the second substrate 121 for displaying images. In still other embodiments of the present disclosure, each of the first light-emitting elements 102 can respectively display image in response to image signal provided by the first driving circuit device 104 disposed on the first substrate 101; and each of the second lighting-elements 122 can respectively display image in response to image signal provided by the second driving circuit device 124 disposed on the second substrate 121.

In yet another embodiments of the present disclosure, the first driving circuit device 104 and the second driving circuit device 124 may be integrated into a union driving circuit element (not shown) disposed neither on the first peripheral region adjacent to the first edge 101d of the first substrate 101 or on the second peripheral region adjacent to the second edge 121d of the second substrate 121, and used to drive the first light-emitting elements 102 and the second lighting-elements 122 to display an image at the same time. In sum, any display panel using at least one driving circuit device (for example, the first driving circuit device 104 and the second driving circuit device 124) that is disposed adjacent to at least one edge of the display panel 10 (for example, the first edge 101d of the first substrate 101 and/or the second edge 121d of the second substrate 121) to provide image signal to the light-emitting elements (for example, the first light-emitting elements 102 and the second light-emitting elements 122) formed on the two adjacent spliced substrates for displaying image does not depart from the scope and spirit of the present disclosure.

Figure 2:
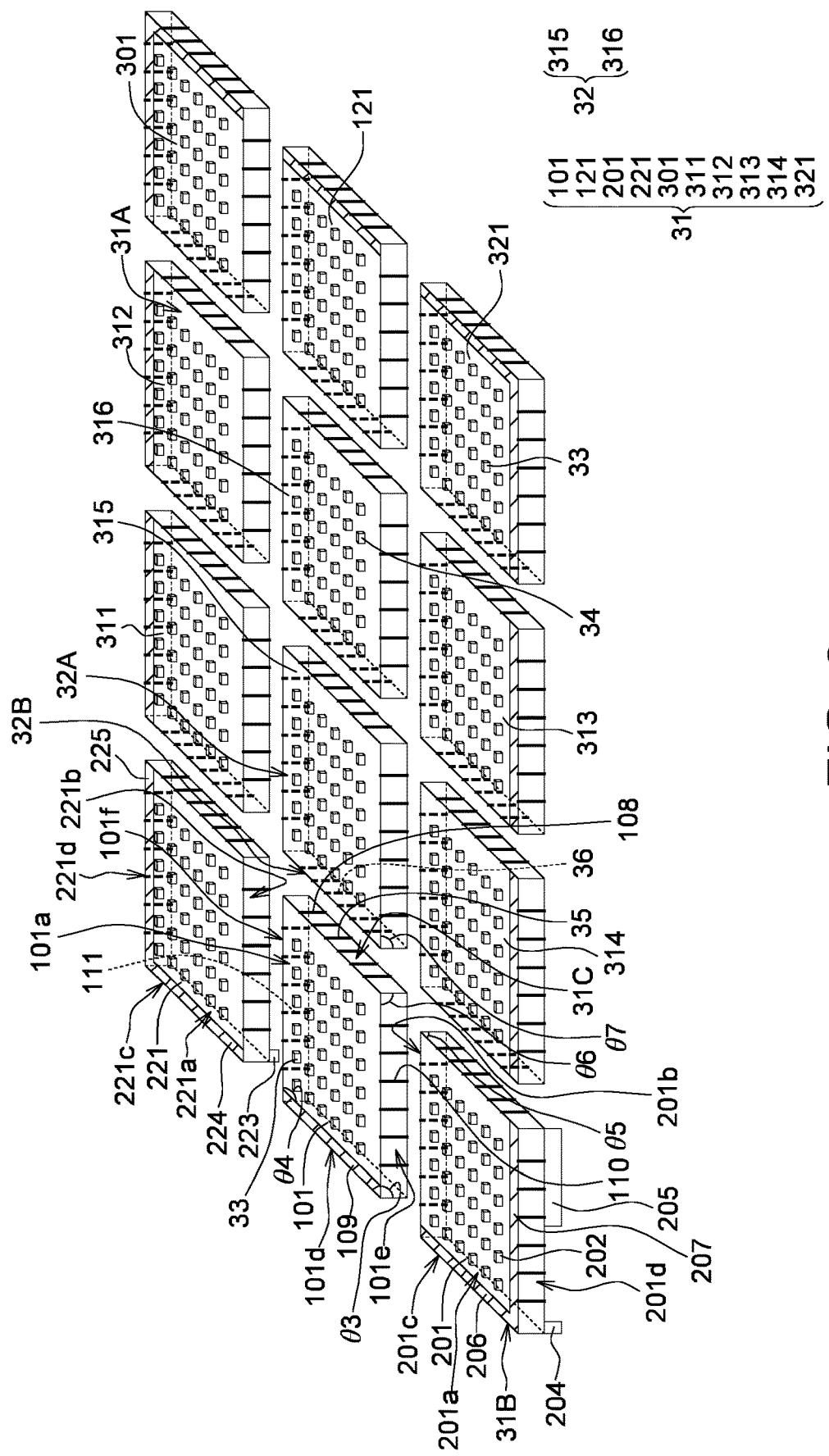
FIG. 2 is a simplified prospective view illustrating a display panel in accordance with another embodiment of the present disclosure.

In some other embodiments, the display panel may include more substrate. For example, FIG. 2 is a simplified prospective view illustrating a display panel 20 in accordance with another embodiment of the present disclosure. In comparison with the display panel 10 of FIG. 1, the display panel 20 at least further includes a third substrate 201 and a fourth substrate 221 respectively spliced to the both sides of the first edge 101d of the first substrate 101. And there are plural of other substrates without carrying any driving circuit device, such as the core substrates 315 and 316 (the detailed structure of these substrates will be described later) disposed between the first substrate 101 and the second substrate 121.

For example, in the present embodiment, the first substrate 101 further includes a third sidewall 101e, a fourth sidewall 101f, a third patterned conductive layer 110 and a fourth patterned conductive layer 111. The third sidewall 101e is disposed on the opposite side of the fourth sidewall 101f, that is, the third sidewall 101e and the fourth sidewall 101f are disposed on two opposite sides of the first substrate 101. The third sidewall 101e is connected to both the first light output surface 101a and the first edge 101d; and the fourth sidewall 101f is connected to both the first light output surface 101a and the first edge 101d. The first light output surface 101a and the third sidewall 101e forms a non-180° angle Θ3; and the first light output surface 101a and the fourth sidewall 101f forms a non-180° angle Θ4. The third patterned conductive layer 110 is disposed on the third sidewall 101e; and the fourth patterned conductive layer 111 is disposed on the fourth sidewall 101f.

The third substrate 201 has a third light output surface 201a, a fifth sidewall 201b, and a plurality of third light-emitting elements 202 disposed on the third light output surface 201a. Wherein, the fifth sidewall 201b is connected to the third light output surface 201a and forms a non-180° angle Θ5 with the third light output surface 201a. When the first substrate 101 and the third substrate 201 are spliced, the fifth sidewall 201b of the third substrate 201 is in contact with the third sidewall 101e of the first substrate 101, and the third light output surface 201a is coplanar with the first light output surface 101a.

The third substrate 201 may further include a third driving circuit device 204 and a fourth driving circuit device 205. The third driving circuit device 204 is disposed on the surface opposite to the third light output surface 201a of the third substrate 201 and is adjacent to the third edge 201c of the third substrate 201. The fourth driving circuit device 205 is disposed on the surface opposite to the third light output surface 201a of the third substrate 201 and is adjacent to a fourth edge 201d of the third substrate 201. The third edge 201c of the third substrate 201 is respectively connected to the fourth edge 201d of the third substrate 201 and the first edge 101d of the first substrate 101, wherein the third edge 201c and the fourth edge 201d of the third substrate 201 are not parallel to each other (for example, may be perpendicular to each other). Each of the third light-emitting elements 202 can be electrically connected to the third driving circuit device 204 and/or the fourth driving circuit device 205 through a wire (not shown), and responds the image signal respectively provided by the third driving circuit device 204 and/or the fourth driving circuit device 205 to display image.

In order to prevent the third driving circuit device 204 and the fourth driving circuit device 205 from adversely affecting the display quality of the display panel 20, a third black light-shielding layer 206 may be formed (or coated) on a peripheral region of the third light output surface 201a adjacent to the third edge 201c of the third substrate 201 to overlap the third driving circuit device 204; and a fourth black light-shielding layer 207 can be formed (or coated) on a peripheral region of the third light output surface 201a adjacent to the fourth edge 201d of the third substrate 201 to overlap the fourth driving circuit device 205.

In addition, the display panel 20 may further include a fourth substrate 221 spliced with the first substrate 101. The fourth substrate 221 has a fourth light output surface 221a, a sixth sidewall 221b connected to the fourth light output surface 221a, and a plurality of fourth light-emitting elements 222 disposed on the fourth light output surface 221a. When the first substrate 101 is spliced with the fourth substrate 221, the sixth sidewall 221b of the fourth substrate 221 can be in contact with the fourth sidewall 101f of the first substrate 101; and the fourth light output surface 221a of the fourth substrate 221 and the first light output surface 101a of the first substrate 101 are coplanar.

In the present embodiment, the fourth substrate 221 further includes a fifth driving circuit device 223, which is disposed on the surface opposite to the fourth light output surface 221a of the fourth substrate 221, and is adjacent to a fifth edge 221c or a sixth edge 221d of the fourth substrate 221. The fifth edge 221c of the fourth substrate 221 is connected to both the first edge 101d of the first substrate 101 and the sixth edge 221d of the four substrates 221, wherein the fifth edge 221c and the sixth edge 221d are not parallel to each other (for example, they may be perpendicular to each other).

Similarly, in order to prevent the fifth driving circuit device 223 from affecting the display quality of the display panel 20, a fifth black light-shielding layer 224 and a sixth black light-shielding layer 225 can be formed (or coated) on the peripheral regions of the fourth light output surface 221a respectively adjacent to the fifth edge 221c and the sixth edge 221d of the fourth substrate 221 to overlap the fifth driving circuit device 223.

In some embodiments of the present disclosure, a plurality of substrates (hereinafter collectively referred to as frame substrates) respectively having the same (similar) structure as the first substrate 101, the third substrate 201, and the fourth substrate 221 may be connected with each other, so as to define a frame portion 31 of the display panel 20. And a plurality of substrates (hereinafter collectively referred to as a core substrates) without carrying any driving circuit device are used to define a core portion 32 of the display panel 20.

For example, in some embodiments of the present disclosure, the frame portion 31 of the display panel 20 includes a frame substrate 301 having the same (similar) structure as the third substrate 201, a frame substrate 321 having the same (similar) structure as the fourth substrate 221, and five frame substrates 311, 312, 313, and 314 each of which has the same (similar) structure as the third substrate 201. Wherein, the frame substrate 301 is disposed diagonally opposite to the third substrate 201; and the frame substrate 321 is disposed diagonally opposite to the fourth substrate 221. The frame substrates 311 and 312 are disposed between the fourth substrate 221 and the frame substrate 301, and the four are arranged in a row. The second substrate 121 is disposed between the frame substrates 301 and 321, and the three are arranged in a row. The frame substrates 313 and 314 are disposed between the third substrate 201 and the frame substrate 321, and the four are arranged in a row. The frame portion 31 having a square frame structure can be formed by connecting the first substrate 101, the second substrate 121, the third substrate 201, the fourth substrate 221, and the frame substrates 301, 311, 312, 313, 314, and 321 with each other.

The plural light output surfaces of the first substrate 101, the second substrate 121, the third substrate 201, the fourth substrate 221, and the frame substrates 301, 311, 312, 313, 314, and 321 can collectively define a frame light output surface 31A. The frame portion 31 further includes an outer sidewall 31B (for example, a sidewall connected to the third edge 201c of the third substrate 201) and an inner sidewall 31C opposite to the outer sidewall 31B, wherein the outer sidewall 31B surrounds the frame light output surface 31A; and the inner sidewall 31C is connected to the frame light output surface 31A, and forms a non-180° angle Θ6 with the frame light output surface 31A.

The core portion 32 of the display panel 20 includes two core substrates 315 and 316 connected to each other and surrounded by the frame portion 31. The structures and splicing methods of the core substrates 315 and 316 are substantially similar to that of the first substrate 101, the third substrate 201, and the fourth substrate 221. The only difference is that the core substrates 315 and 316 do not carry any driving circuit device. The light output surfaces of the core substrates 315 and 316 can be integrated into one core light output surface 32A, surrounded by the frame light output surface 31A, and coplanar with the frame light output surface 31A. The core portion 32 also has a core sidewall 32B facing the inner sidewall 31C of the frame portion 31, wherein the core sidewall 32B is connected to the surface of the core light output surface 32A, and forms a non-180° angle Θ7 with the core light output surface 32A.

The frame portion 31 of the display panel 20 further includes an frame patterned conductive layer 35 (such as the first patterned conductive layer 108 serving as part of it) disposed on the inner sidewall 31C, and can be electrically connected to the frame light-emitting elements 33 (including the first light-emitting elements 102, the second light-emitting elements 102, the third light-emitting elements 202, the fourth light-emitting elements 202, and the light-emitting elements respectively formed on the plural light output surfaces of the frame substrate 301, 311, 312, 313, 314 and 321). The core portion 32 of the display panel 20 further includes a core patterned conductive layer 36 disposed on the core sidewall 32B, which can be electrically connected to the core light-emitting elements 34 formed on the core light emitting surface 32A.

By the aforementioned splicing method, the frame light-emitting elements 33 disposed on the frame portion 31 and the core light-emitting elements 34 disposed on the core portion 32 can be electrically connected to at least one driving circuit device (for example, the third driving circuit device 204) disposed on the frame substrate (for example, the third substrate 201). Such that, they can respectively display an image in response to an image signal provided by the driving circuit device.

The black light-shielding layers (including the first black light-shielding layer 109, the third black light-shielding layer 206, the fourth black light-shielding layer 207, the fifth black light-shielding layer 224, and the sixth black light-shielding layer 225) respectively disposed on the first substrate 101, the second substrate 121, the third substrate 201, the fourth substrate 221, and the frame substrates 301, 311, 312, 313, 314, and 321 can be integrated into a single frame black light-shielding layer. Since, the single frame black light-shielding layer is disposed adjacent to the outer sidewall 31B to overlap the driving circuit devices (for example, the third driving circuit device 204), thus it the problems due to the reflected light of the driving circuit devices that may adversely affect the display quality of the display panel 20 can be alleviated.

In accordance with the aforementioned embodiments of the present disclosure, a display panel formed by splicing a plurality of substrates is provided, wherein the display panel includes at least one substrate adjacent to the outer edge of the display panel. The substrate has a plurality of first light-emitting elements, a sidewall, a patterned conductive layer, a driving circuit device, and a black light-shielding layer. The first light-emitting elements are disposed on a light output surface that connects to the sidewall to from a non-180° angle. The patterned conductive layer is disposed on the sidewall. The driving circuit device is disposed adjacent to the edge of the substrate. The black light-shielding layer overlaps with the driving circuit device. Wherein, the driving circuit device can be electrically connected to the first light-emitting elements and the light-emitting elements that are disposed on another substrate spliced with the substrate to provide image signal for displaying image. By this arrangement, the driving circuit device can be disposed on the peripheral region of the display panel and covered by a black light-shielding layer to alleviate the problems due to the reflected light of the driving circuit device that may adversely affect the display quality of the display panel.

In accordance with the aforementioned embodiments of the present disclosure, a display panel formed by splicing a plurality of substrates is provided, wherein the display panel includes at least one substrate adjacent to the outer edge of the display panel. The substrate has a plurality of light-emitting elements, a sidewall, a patterned conductive layer, a driving circuit device, and a black light-shielding layer. The light-emitting elements are disposed on a light output surface that connects to the sidewall to from a non-180° angle. The patterned conductive layer is disposed on the sidewall. The driving circuit device is disposed adjacent to the edge of the substrate. The black light-shielding layer overlaps with the driving circuit device. When two adjacent substrates are spliced, the light-emitting elements respectively disposed on the two adjacent spliced substrates can be electrically connected to the same driving circuit device disposed on the edge of the display panel by the patterned conductive layer of the spliced substrates, whereby image signal can be provided by the same driving circuit device for displaying image. The driving circuit device is covered with a black light-shielding layer to prevent the reflected light of the driving circuit device from adversely affecting the display quality of the display panel.

In one embodiment of the present disclosure, a plurality of frame substrates adjacent to the edge of a display panel are spliced to form a frame portion of the display panel, by which a core portion of the display panel formed by a plurality of core substrates splicing with each other is surrounded. Wherein, the driving circuit devices of the display panel are merely disposed on one or more of the frame substrates adjacent to the peripheral region of the display panel; and no any driving circuit device is arranged on the core substrates. A plurality of core light-emitting elements disposed on the core substrates and a plurality of frame light-emitting elements disposed on the frame substrates can display an image in response to image signal provided by the same driving circuit devices.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A display panel formed by splicing a plurality of substrates, comprising:
    a first substrate, having a first light output surface and a first sidewall, wherein the first sidewall connects to the first light output surface, and forms a non-180° angle with the first light output surface;
    a plurality of first light-emitting elements, disposed on the first light output surface;
    a first patterned conductive layer, disposed on the first sidewall;
    a first driving circuit device, disposed on the first substrate, adjacent to a first edge of the first substrate and electrically connected to one of the first light-emitting elements;
    a second substrate, comprising a second light output surface and a second sidewall connected to the second light output surface, wherein the first sidewall is in contact with the second sidewall, and the first light output surface is coplanar with the second light output surface; and
    a plurality of second light-emitting elements, disposed on the second light output surface; and
    a second patterned conductive layer, disposed on the second sidewall and electrically connected to the second light-emitting elements;
    wherein the first driving circuit device is disposed on a surface opposite to the first light output surface and electrically connected to the first light-emitting elements and the second light-emitting elements.

2. The display panel according to claim 1, wherein the first patterned conductive layer is electrically in contact with the second patterned conductive layer.

3. The display panel according to claim 2, further comprising:
    a first wire, disposed on the surface opposite to the first light output surface and electrically connected to the first patterned conductive layer and the first light-emitting elements;
    a second wire, disposed on a surface opposite to the second light output surface and electrically connected to the second patterned conductive layer and the second light-emitting elements; and
    a plurality of first conductive plugs passing through the first substrate, wherein each of the first conductive plugs has one end electrically connected to one of the first light-emitting elements and another end electrically connected to the first wire; and
    a plurality of second conductive plugs passing through the second substrate, wherein each of the second conductive plugs has one end electrically connected to one of the second light-emitting elements and another end electrically connected to the second wire.

4. The display panel according to claim 3, further comprising a first black light-shielding layer formed on the first light output surface for overlapping the first driving circuit device.

5. The display panel according to claim 1, wherein the first substrate further comprises:
    a third sidewall, connected to both of the first light output surface and the first edge, and forms a non-180° angle with the first light output surface;
    a fourth sidewall connected to both of the first light output surface and the first edge, and forms a non-180° angle with the first light output surface;
    a third patterned conductive layer, disposed on the third sidewall; and
    a fourth patterned conductive layer, disposed on the fourth sidewall.

6. The display panel according to claim 5, further comprising:
    a third substrate, comprising a third light output surface and a fifth sidewall, wherein the fifth sidewall is connected to the third light output surface and in contact to the third sidewall; and the third light output surface is coplanar with the first light output surface;
    a plurality of third light-emitting elements, disposed on the third light output surface;
    a third driving circuit device, disposed on the third substrate, and adjacent to a third edge of the third substrate;
    a fourth driving circuit device, disposed on the third substrate, and adjacent to a fourth edge of the third substrate, wherein the third edge is respectively connected to the fourth edge and the first edge, and the third edge and the fourth edge are not parallel to each other;
    a third black light-shielding layer, formed on the third light output surface, and disposed adjacent to the third edge to overlap the third driving circuit device; and
    a fourth black light-shielding layer, formed on the third light output surface, and disposed adjacent to the fourth edge to overlap the fourth driving circuit device.

7. The display panel according to claim 6, further comprising:
    a fourth substrate, comprising a fourth light output surface and a sixth sidewall, wherein the sixth sidewall is connected to the fourth light output surface and in contact to the fourth sidewall; and the fourth light output surface is coplanar with the first light output surface;
    a plurality of fourth light-emitting elements, disposed on the fourth light output surface;
    a fourth driving circuit device, disposed on the fourth substrate, adjacent to a third edge of the third substrate;
    a fifth driving circuit device, disposed on the fourth substrate, adjacent to a fifth edge or a sixth edge of the fourth substrate, wherein the fifth edge is respectively connected to the sixth edge and the first edge, and the fifth edge and the sixth edge are not parallel to each other;
    a fifth black light-shielding layer, formed on the fourth light output surface, and disposed adjacent to the fifth edge; and
    a sixth black light-shielding layer, formed on the fourth light output surface, and disposed adjacent to the sixth edge, wherein on of the fifth black light-shielding layer and the sixth black light-shielding layer overlaps the fifth driving circuit device.

8. The display panel according to claim 3, further comprising a plurality of bonding pads formed on the first light output surface, and electrically connected to the first conductive plugs.

9. The display panel according to claim 8, wherein each one of the first light-emitting elements comprises at least one micro-light-emitting diode (micro-LED) die landed on one of the bonding pads.

10. The display panel according to claim 3, wherein the first patterned conductive layer extends vertically upward beyond the first sidewall, and is electrically connected to the first wire.

11. The display panel according to claim 1, wherein each of the first light-emitting elements comprises a plurality of micro-LED dies respectively emitting different light of different colors.

12. The display panel according to claim 1, wherein the plural first light-emitting elements are arranged on the first light output surface to form a pixel array.

13. A display panel formed by splicing a plurality of substrates, comprising:
- a plurality of frame substrates, connected with each other to define a frame portion of the display panel, wherein the frame portion has a frame light output surface, an outer sidewall surrounding the frame light output surface and an inner sidewall opposite to the outer sidewall; and the inner sidewall is connected to the frame light output surface to form a non-180° angle;
- a plurality of core substrates, connected with each other to define a core portion of the display panel, wherein the core portion has a core light output surface and a core sidewall; the core light output surface is connected to the core sidewall to form a non-180° angle; the inner sidewall faces the core sidewall; and the core light output surface is coplanar with the frame light output surface;
- a driving circuit device, disposed either on the frame light output surface or on a surface the opposite to the frame light output surface, and adjacent to the outer sidewall;
- a plurality of frame light-emitting elements, disposed on the frame light output surface, and electrically connected to the driving circuit device;
- a plurality of core light-emitting elements, disposed on the core light output surface;
- a frame patterned conductive layer, disposed on the inner sidewall, and electrically connected to at least one of the plural frame light-emitting elements;
- a core patterned conductive layer, disposed on the core sidewall, electrically in contact with the frame patterned conductive layer, and electrically connected to at least one of the plural core light-emitting elements; and
- a black light-shielding layer, disposed on the frame light output surface, adjacent to the outer sidewall, and overlapping the driving circuit device.

14. The display panel according to claim 13, wherein at least one of the plural core substrates is disposed between two of the plural frame substrates and the three are arranged in a row.

15. The display panel according to claim 13, wherein two of the plural frame substrates having the same structure are disposed diagonally opposite to each other.

16. The display panel according to claim 13, wherein three of the plural frame substrates are arranged in a row.

17. The display panel according to claim 13, wherein each one of the plural core substrates do not carry any driving circuit devices.

* * * * *